United States Patent
DiBene, II et al.

(10) Patent No.: US 6,429,386 B2
(45) Date of Patent: Aug. 6, 2002

(54) IMBEDDED DIE-SCALE INTERCONNECT FOR ULTRA-HIGH SPEED DIGITAL COMMUNICATIONS

(75) Inventors: Joseph T. DiBene, II, Oceanside; P. Keith Muller; Irving M. Robinson, both of San Diego, all of CA (US)

(73) Assignee: NCR Corporation, Dayton, OH (US)

( * ) Notice: Subject to any disclaimer, the term of this patent is extended or adjusted under 35 U.S.C. 154(b) by 0 days.

(21) Appl. No.: 09/892,960

(22) Filed: Jun. 27, 2001

Related U.S. Application Data

(63) Continuation of application No. 09/223,517, filed on Dec. 30, 1998.

(51) Int. Cl.[7] .................................................. H05K 1/16
(52) U.S. Cl. ...................................... 174/260; 361/761
(58) Field of Search .................................. 361/761, 762, 361/763, 764, 783, 807, 809, 792–795; 174/260

(56) References Cited

U.S. PATENT DOCUMENTS

| | | | | |
|---|---|---|---|---|
| 5,241,456 A | * | 8/1993 | Marcinkiewicz et al. ... | 361/792 |
| 5,359,496 A | * | 10/1994 | Kornrumpf et al. ........ | 361/795 |
| 5,384,691 A | * | 1/1995 | Neugebauer et al. ....... | 361/794 |
| 6,166,911 A | * | 12/2000 | Usami et al. ............... | 361/737 |

* cited by examiner

Primary Examiner—Kamand Cuneo
Assistant Examiner—Jeremy Norris
(74) Attorney, Agent, or Firm—Gates & Cooper; John D. Cowart

(57) ABSTRACT

A printed circuit board with an imbedded electrical component, comprising three layers. The first and second layers are coupled together, and an area of the second layer of the printed circuit board is selectively removed to expose a portion of the first layer of the printed circuit board. The opening accepts an electrical component that is mounted to the first layer of the printed circuit board within the selectively removed area of the second layer of the printed circuit board. The third layer of the printed circuit board is coupled to the second layer of the printed circuit board, at least partially covers the selectively removed area of the second layer of the printed circuit board, and at least partially covers the mounted component within the selectively removed area of the second layer of the printed circuit board.

4 Claims, 2 Drawing Sheets

IMBEDDED DIE-SCALE INTERCONNECT FOR ULTRA-HIGH SPEED DIGITAL COMMUNICATIONS

This application is a continuation of U.S. application Ser. No. 09/223,517, filed Dec. 30, 1998.

BACKGROUND OF THE INVENTION

1. Field of the Invention

This invention relates in general to printed circuit board manufacture, and in particular, to an imbedded die-scale interconnect for ultra-high speed digital communications.

2. Description of Related Art

As circuitry in electronics becomes more and more complex, packaging of the circuitry has become more difficult. The use of Printed Circuit Boards (PCBs) has made packaging of integrated circuits and other electronic components easier and efficient.

Computer chip clocking speeds have also increased. This increase in speed has made it difficult to couple chips together in such a way that the chip speeds are completely useable. Typically, the limitations of a system are contributed to, in part, by the packaging of the system itself.

On a PCB, interconnections are made using traces that are etched onto a layer of the PCB. To create shorter interconnections, Surface Mount Technology (SMT) chips, Very Large Scale Integration (VLSI) circuits, flip chip bonding, Application Specific Integrated Circuits (ASICs), and the like, have been wire bonded directly to PCBs to shorten the transit time and interconnection lengths between chips on a PCB. However, this technology has also not completely overcome the needs for higher signal speeds both intra-PCB and inter-PCB.

In any given system, PCB area (also known as PCB "real estate") is at a premium With smaller packaging envelopes becoming the norm in electronics, e.g., laptop computers, spacecraft, cellular telephones, etc., large PCBs are not available for use to mount SMT chips or other devices. Methods are needed to decrease the size of PCBs, while still maintaining the functionality of the PCB.

It can be seen, then, that there is a need in the art for a method for decreasing the size of PCBs while maintaining the functionality of PCBs. Further, there is a need for reducing the size of PCBs while using present-day manufacturing techniques to maintain low cost packaging.

SUMMARY OF THE INVENTION

To overcome the limitations in the prior art described above, and to overcome other limitations that will become apparent upon reading and understanding the present specification, the present invention discloses a printed circuit board and a method for making a printed circuit board with an imbedded electrical component, comprising three layers. The first and second layers are coupled together, and an area of the second layer of the printed circuit board is selectively removed to expose a portion of the first layer of the printed circuit board. The opening accepts an electrical component that is mounted to the first layer of the printed circuit board within the selectively removed area of the second layer of the printed circuit board. The third layer of the printed circuit board is coupled to the second layer of the printed circuit board, at least partially covers the selectively removed area of the second layer of the printed circuit board, and at least partially covers the mounted component within the selectively removed area of the second layer of the printed circuit board.

An object of the present invention is to provide more efficient usage of printed circuit board real estate. Another object of the present invention is to increase the density of electronics on printed circuit boards.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to the accompanying detailed description, in which there is illustrated and described specific examples of a method, apparatus, and article of manufacture in accordance with the invention.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to the accompanying drawings which form a part hereof, and in which is shown byway of illustration a specific embodiment in which the invention may be practiced. It is to be understood that other embodiments may be utilized and structural changes may be made without departing from the scope of the present invention.

Overview

The present invention discloses a printed circuit board and a method for making a printed circuit board with an imbedded die-level electrical component, comprising three layers. The first and second layers are coupled together, and an area of the second layer of the printed circuit board is selectively removed to expose a portion of the first layer of the printed circuit board. The opening accepts an electrical component that is mounted to the first layer of the printed circuit board within the selectively removed area of the second layer of the printed circuit board. The third layer of the printed circuit board is coupled to the second layer of the printed circuit board, at least partially covers the selectively removed area of the second layer of the printed circuit board, and at least partially covers the mounted component within the selectively removed area of the second layer of the printed circuit board.

Printed Circuit Board Illustration

Figure 1A:
FIGS. 1A–1E illustrate the construction of a printed circuit board using the present invention.

FIGS. 1A–1E illustrate the construction of a printed circuit board using the present invention. FIG. 1A illustrates PCB 100 and layer 102. Layer 102 is typically a laminate material, typically fiberglass or other dielectric material, that is electrically non-conductive. Layer 102 acts as a mechanical support for the remainder of the PCB 100.

Figure 1B:
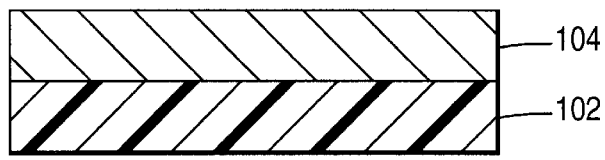

FIG. 1B illustrates layer 104 being added to one side of layer 102 of the PCB 100. Layer 104 is typically an electrically conductive layer, such as copper, but can be other materials. Layer 104 can be coupled to layer 102 by several means, e.g., compression, deposition, or other coupling techniques. Layer 104 can also be etched to selectively remove portions of layer 104 to produce electrical traces, pads, etc.

Figure 1C:
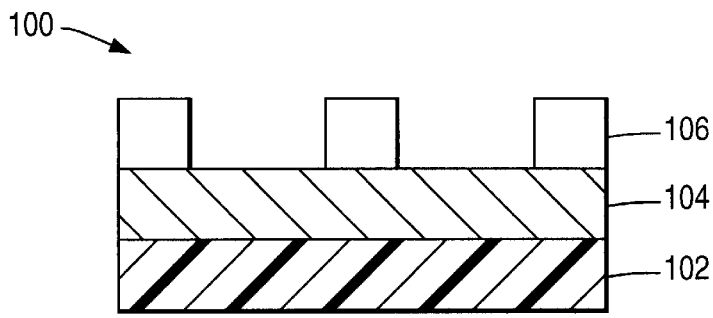

FIG. 1C illustrates a second laminate layer 106 being added to layer 104. Layer 106 insulates layer 104 from other layers, such that traces on layer 104 can cross over traces on other layers of the PCB 100 without electrically connecting the traces on layer 104 in an unwanted manner. Layer 106 is shown as having openings 108 or "cutouts" within layer 106. These openings 108 provide a space for items other than layer 106 to be coplanar with layer 106. The build up of alternate layers of conductive and nonconductive materials can continue for several layers as desired to complete the PCB 100. For illustrative purposes only, the PCB 100 is shown with only one conductive layer 104 sandwiched between layers 102 and 106 and only one layer 106 with openings 108. However, additional conductive layers 104 and additional layers 106 with openings 108 are possible within the scope of the present invention.

Figure 1D:
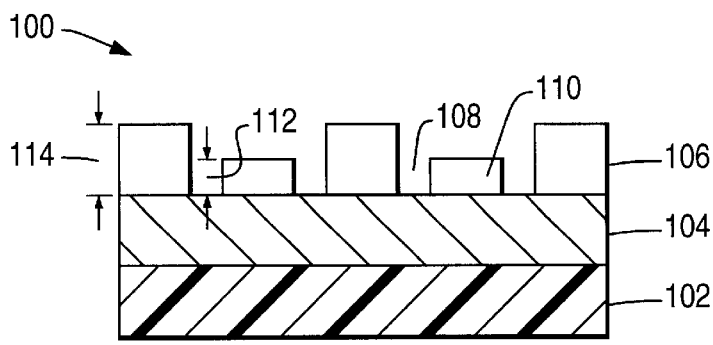

FIG. 1D illustrates die level components 110 being mounted within openings 108 of layer 106. The components 110 fit within opening 108, and the height 112 of component 110 is shown as smaller than height 114 of layer 106. This allows for wire bonding of component 110 to traces on layer 104, protects component 110 from being damaged by additional layers to be added to PCB 100, and, if proper materials are used for layers 102–106, and openings 108 are designed properly, the opening 108 and height 114 can provide electromagnetic shielding for component 110.

Figure 1E:
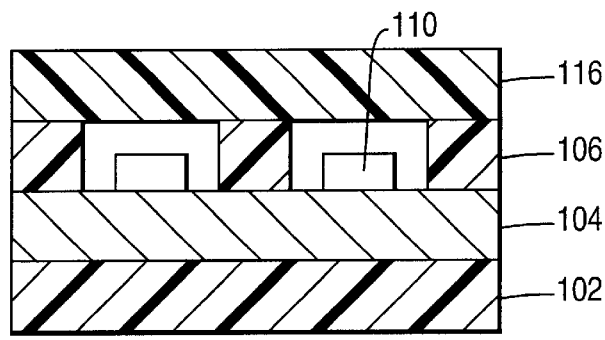

FIG. 1E illustrates a layer 116 being attached to layer 106. Layer 116 is coupled to layer 106 opposite to where component 110 is mounted to layer 104. Layer 116 would typically be an electrically insulating material, but can be electrically conducting if desired. For example, for mechanical protection of component 110, layer 116 might be a laminate material; however, if component 110 requires a Faraday cage to electromagnetically shield component 110, layer 116 can be electrically conductive. Further, layer 116 can provide other radiation protection for component 110, such as alpha and beta particle and gamma ray radiation experienced by components mounted to spacecraft. Layer 116 is shown as completely covering opening 108, however, layer 116 may only partially cover opening 108 if desired. This may be desired if component 110 requires optical or other inputs from outside of layer 116, e.g., if component 110 is a photodetector, light must shine through layer 116 to reach component 110, and thus, layer 116 may have a hole or otherwise allow light to reach component 110.

The present invention's use of die mounting within a PCB 100 allows designers methods for increasing density of the functions performed by a given area of PCB. Additional components 110 can still be mounted on layer 116, either to "double up" the number of chips mounted on a given PCB 100, or to provide additional functions to the PCB 100. Further, the PCB 100 layers 102, 104, 106, and 116 can be used to help mechanically and/or electromagnetically protect component 110.

Since PCB 100 can contain many layers, multiple layers 106 with openings 108 are possible with the present invention.

Embodiments Using the Present Invention

Figure 2:
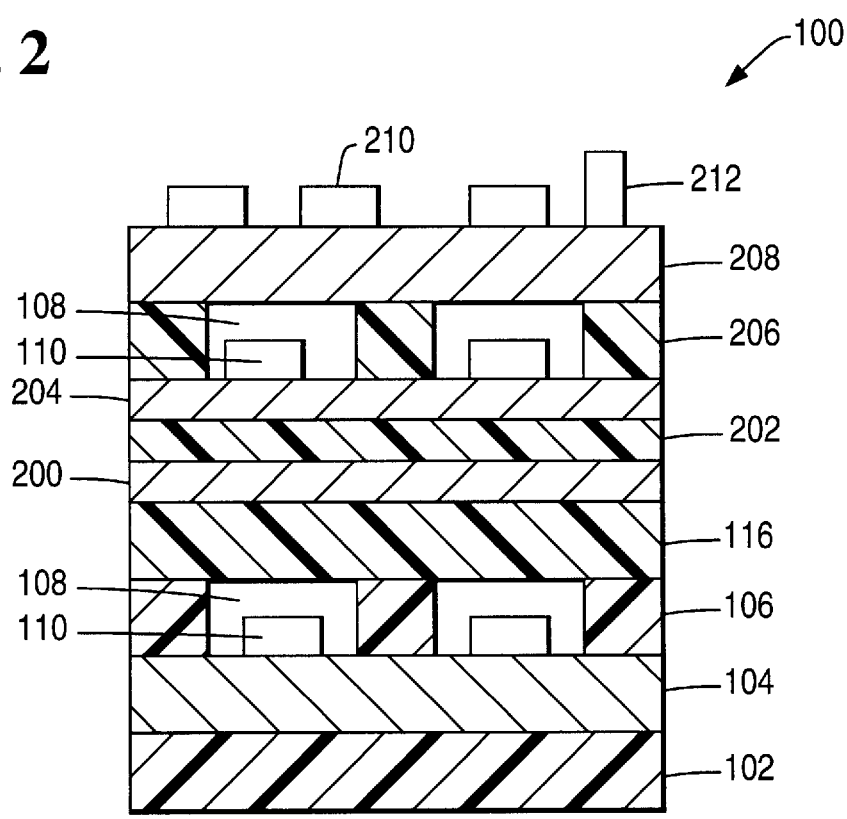
FIG. 2 illustrates several possible placement of components using the present invention.

FIG. 2 illustrates several possible placements of components using the present invention. FIG. 2 again shows PCB 100, with layers 102, 104, 106, and 116. Component 110 is mounted within opening 108 of layer 106. Layer 200 is coupled to layer 116, opposite to the side of layer 116 that is coupled to layer 106. Layer 200 can be a conductive layer, an electromagnetic shielding layer, or any layer desired within PCB 100. Similarly, layer 202 is attached to layer 200, layer 204 is attached to layer 202, and layer 206 is attached to layer 204. Layer 206 again has openings 108 to accommodate components 110. Layer 208 is coupled to layer 206, and covers openings 108 and components 110 within openings 108 of layer 206.

Components 210 and 212 are mounted on layer 208 on a side of layer 208 opposite to the side that covers openings 108. This allows for components to be mounted, essentially, on top of another without electrical coupling of the components. This allows for higher chip density on PCB 100.

Figure 3:
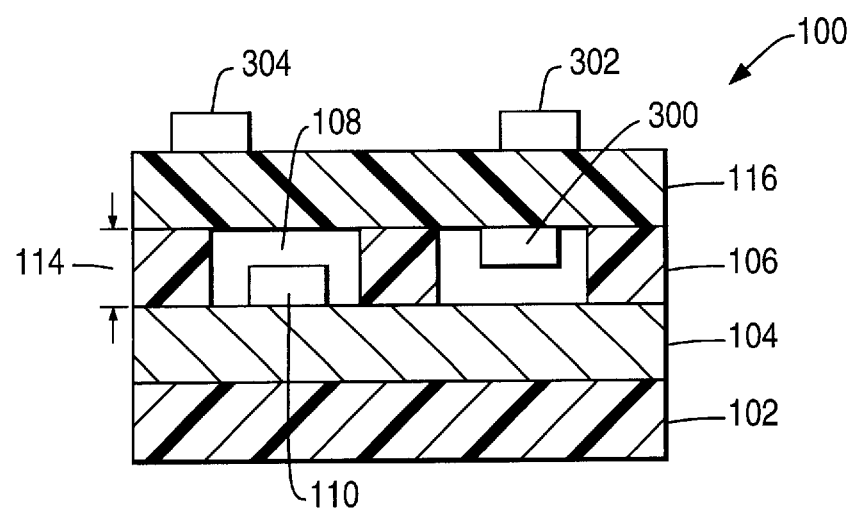
FIG. 3 illustrates other placements of components using the present invention.

FIG. 3 illustrates other placements of components using the present invention. Components 300 can also be mounted on layer 116 and mechanically positioned to fit within opening 108. This allows for components 110 and 300 to be mounted within the thickness 114 of layer 106 without requiring component 300 to physically rest on layer 104. This adds flexibility in terms of trace layout on layers 104 and 116, because components 110 and 300 now can be positioned to maximize density on PCB 100. Further, components 302 and 304 can be mounted on the opposite side of layer 116, allowing for additional density increases on PCB 100. Additional components can be added to layer 102 on the side of layer 102 opposite that of layer 104.

CONCLUSION

This concludes the description of the preferred embodiment of the invention. The following describes some alternative embodiments for accomplishing the present invention. PCB 100 can have both rigid and flexible layers to accommodate the needs of PCB designers without departing from the scope of the present invention. Further, the thicknesses of the layers of PCB 100 can be modified to accommodate components as needed. The thickness of a layer can be thinner or of the same thickness as a component if desired to enable the PCB designer to connect to both sides of the component. Openings in the layers that receive components can also be filled with material, e.g., supportive material, glues or other binding material, thermally conductive materials, inert materials, etc. to better mechanically, thermally, electromagnetically, and environmentally support the component therein.

In summary, the present invention discloses a printed circuit board with an imbedded electrical component, comprising three layers. The first and second layers are coupled together, and an area of the second layer of the printed circuit board is selectively removed to expose a portion of the first layer of the printed circuit board. The opening accepts an electrical component that is mounted to the first layer of the printed circuit board within the selectively removed area of the second layer of the printed circuit board. The third layer of the printed circuit board is coupled to the second layer of the printed circuit board, at least partially covers the selectively removed area of the second layer of the printed circuit board, and at least partially covers the mounted component within the selectively removed area of the second layer of the printed circuit board.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A multi-layer printed circuit board, comprising:
   a first layer;
   an electronic component mounted on the first layer;
   a second layer formed over the first layer and having an opening into which the electronic component on the first layer protrudes;
   a third layer formed over the second layer and covering at least a portion of the opening and at least a portion of the electronic component in the opening; and
   a second electronic component mounted to the third layer and protruding into an opening in the second layer.

2. A multi-layer printed circuit board, comprising:
   a first layer;
   an electronic component mounted on the first layer;
   a second layer formed over the first layer and having an opening into which the first electronic component protrudes;
   a third layer formed over the second layer and covering at least a portion of the opening and at least a portion of the electronic component in the opening, where the third layer is constructed to provide electromagnetic protection for the electronic component.

3. A method for use in manufacturing a multi-layer printed circuit board, comprising:
   forming a first layer of the printed circuit board;
   mounting an electronic component to the first layer;
   forming a second layer over the first layer, such that the second layer includes an opening into which the electronic component on the first layer protrudes;
   forming a third layer over the second layer, such that the third layer covers at least a portion of the opening and at least a portion of the electronic component mounted to the first layer; and
   mounting an electronic component to the third layer, such that the electronic component on the third layer protrudes into an opening in the second layer.

4. A method for use in manufacturing a multi-layer printed circuit board, comprising:
   forming a first layer of the printed circuit board;
   mounting an electronic component to the first layer;
   forming a second layer over the first layer, such that the second layer includes an opening into which the electronic component protrudes; and
   forming a third layer over the second layer, such that the third layer covers at least a portion of the opening and at least a portion of the electronic component, where the third layer is selected to provide electromagnetic protection for the electronic component.

* * * * *